US006402882B1

United States Patent
Briand

(10) Patent No.: US 6,402,882 B1
(45) Date of Patent: Jun. 11, 2002

(54) DEVICE AND METHOD FOR ION BEAM ETCHING USING SPACE-TIME DETECTION

(75) Inventor: Jean-Pierre Briand, Antony (FR)

(73) Assignee: Universite Pierre et Marie Curie, Paris (FR)

( * ) Notice: Subject to any disclaimer, the term of this patent is extended or adjusted under 35 U.S.C. 154(b) by 0 days.

(21) Appl. No.: 09/443,093

(22) PCT Filed: May 25, 1998

(86) PCT No.: PCT/FR98/01040

§ 371 (c)(1),
(2), (4) Date: Jan. 5, 2000

(87) PCT Pub. No.: WO98/54747

PCT Pub. Date: Dec. 3, 1998

(30) Foreign Application Priority Data

May 28, 1997 (FR) ............................................. 97 06553

(51) Int. Cl.[7] ................................................. C23F 1/02
(52) U.S. Cl. ............. 156/345; 204/298.36; 204/192.34; 216/66; 216/94; 438/712
(58) Field of Search ...................... 156/345; 204/298.36, 204/192.34; 216/66, 94; 438/712

(56) References Cited

U.S. PATENT DOCUMENTS

| | | | | | |
|---|---|---|---|---|---|
| 4,457,803 A | * | 7/1984 | Takigawa | .................... | 156/626 |
| 4,639,301 A | * | 1/1987 | Doherty et al. | ........ | 204/192.31 |
| 4,734,158 A | * | 3/1988 | Gillis | ......................... | 156/643 |
| 4,761,199 A | * | 8/1988 | Sato | ........................... | 156/345 |
| 4,893,019 A | * | 1/1990 | Oomori | ................... | 250/423 R |
| 4,976,843 A | * | 12/1990 | Ward et al. | ............ | 204/298.32 |
| 5,149,974 A | * | 9/1992 | Kirch et al. | ............. | 250/492.2 |
| 5,294,289 A | * | 3/1994 | Heinz et al. | ................ | 156/626 |
| 5,462,629 A | | 10/1995 | Kubota et al. | | |
| 5,645,897 A | * | 7/1997 | Andra | ......................... | 427/526 |
| 5,916,424 A | * | 6/1999 | Libby et al. | ........... | 240/298.36 |
| 6,238,582 B1 | * | 5/2001 | Williams et al. | .............. | 216/22 |

FOREIGN PATENT DOCUMENTS

DE 42 04 650 7/1993

OTHER PUBLICATIONS

J.–P. Briand et al, "Image Acceleration of Highly Charged Ions on Metal, Semiconductor, and Insulator Surfaces", Physical Review A (Atomic, Molecular, and Optical Physics), Apr., 1997, APS through AIP, USA, vol. 55, No. 4, pp. R2523–R2526.

J.–P. Briand, "Above and Below Surface Interactions of Highly Charged Ions on Metals, Insulators or Semiconductors", Application of Accelerators in Research and Industry, Fourteenth International, Denton, Texas, USA, Nov. 6–9, 1996, No. 392, Pt. 1, pp. 137–140.

J.P. Briand, "Des Ions Très Chargés sur les Surfaces: Les Atomes Creux", Images De La Physique, 1992, pp. 58–62.

* cited by examiner

Primary Examiner—Gregory Mills
Assistant Examiner—Michelle Crowell
(74) Attorney, Agent, or Firm—Arent Fox Kintner Plotkin & Kahn, PLLC

(57) ABSTRACT

The invention concerns a device and a method for ion beam etching for producing an etched surface (2) on a semiconductor (1) or insulant The device comprises a positive ion source (20), means for guiding (23) an ion beam (42), a system for detecting the spatial and temporal interaction of the ions and the etched surface, means for interrupting (24) the beam and means for displacing the etched surface relatively to the beam. A processing unit (29) is connected to the displacing means, to the detecting means and to the beam interrupting means and controls, preferably iteratively, successive, operations detecting interaction of the ion beam and the etched surface, interrupting the beam, relative displacing of the etched surface with respect to the beam position and restoring the beam.

17 Claims, 2 Drawing Sheets

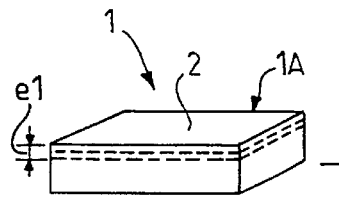
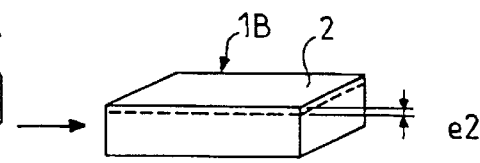
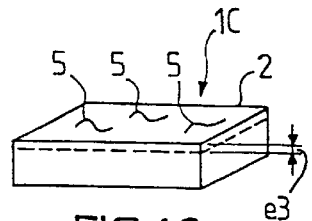
FIG.1A  FIG.1B  FIG.1C
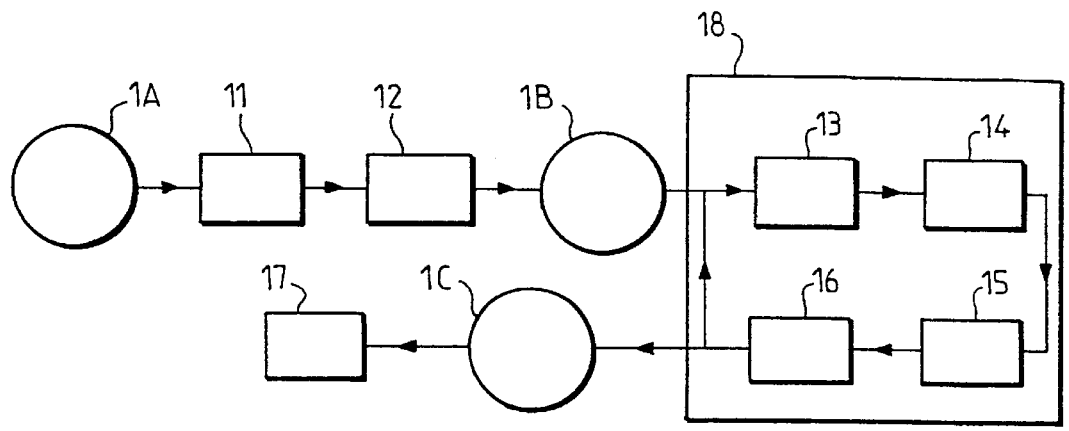
FIG.2
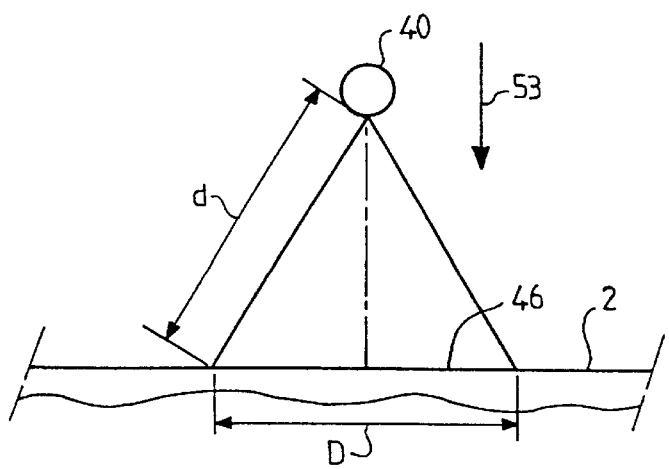
FIG.4

DEVICE AND METHOD FOR ION BEAM ETCHING USING SPACE-TIME DETECTION

DEVICE AND METHOD FOR ION BEAM ETCHING

This invention concerns a device and a method for ion beam etching for producing an etched surface on a semiconductor or an insulant.

Ion beam etching calls for good spatial control of the etching zones on the etched surface. A mask comprising several holes can be used for this purpose. These holes can be several microns in size and enable optimum etching accuracy, in the order of a fraction of a micron, if not smaller. A shortcoming of this technology lies in the fact that it involves realising a mask for each etching pattern.

Another method consists of direct control of the relative position of the incident beam on the etched surface. This control is for example carried out using electric and/or magnetic guiding means and by cooling the beam down, i.e. reduction of the seed component perpendicular to the propagation direction of the beam. The accuracy of this method is further enhanced while associating the direct control with the usage of micro or nano holes. For etching, the semiconductor or the insulant is moved under the beam. This technique improves the accuracy significantly, which reaches a few nm to 100 nm. The reliability of this method is however limited, because of the problems raised by the selection of the exposure duration and the displacement velocity of the semiconductor.

The present invention relates to a highly reliable device and method for ion beam etching, enabling accurate spatial control of the etching process, a control that can be performed electronically.

The invention concerns notably a device and a method for ion beam etching enabling a one-nanometer etching accuracy.

The invention relates to such a device and such a method that can be economical and easy to implement.

To this end, the invention concerns a device for ion beam etching that enables producing an etched surface on a semiconductor or an insulant. The device comprises:
 a positive ion source,
 means for guiding an ion beam thereby directing the beam to the etched surface, and
 means for displacing the etched surface relatively to the ion beam.

According to the invention, the device comprises:
 a system for space-time detection of ion interactions of the beam with the etched surface,
 means for interrupting the ion beam, and
 a processing unit linked to the displacement means, to the detection system and the beam interruption means, controlling the successive operations of: detecting the interruptions of the ions in the beam with the etched surface, beam interruption, relative displacement of the etched surface in relation to the position of the beam and restoring the beam.

Preferably, the processing unit controls the operations mentioned above repeatedly.

In this context, the word (<<surface>> means a superficial part of the semiconductor or insulant, generally cut approximately along a crystallographic plane. The surface is advantageously plane, but can also be curved.

The operations performed with the ion beam are performed under vacuum. This vacuum may correspond to relatively high pressure, for example in the order of $10^{-9}$ Pa. It can also be an ultra-vacuum.

The means of relative displacement of the etched surface with respect to the ion beam may involve displacement of the semiconductor or insulant or displacement of the beam, by varying their positions or their orientations. Etching is then carried out in succession, one zone after the other. According to an embodiment, several beams are directed simultaneously towards the surface.

The space-time detection system detects the positions and the timing of interactions, simultaneously.

The etching device according to the invention enables, with respect to the existing devices, reducing the exposure durations of the etched surface and the relative displacements of the etched surface with respect to the ion beam. This control improves the reliability of the system quite considerably. Indeed, the main difficulty of ion beam etching lies in the fact that the ions reach the target erratically, spatially as well as temporally. The device according to the invention enables suiting the etching process to these erratic phenomena.

The positive ions sent by the source are preferably multicharged, i.e. each of them has three positive charges at least.

Preferably, interactions of the beam ions with the etched surface are carried out one ion after the other.

The etched semiconductor is for instance formed of a material selected among Si, AsGa, InP and Ge. The etched insulant is, for its own part, formed by $SiO_2$ or LiF.

Preferably, the etching device comprises a system for spatial localisation of the ion beam, interposed between the ion source and the etched surface.

This spatial location system consists advantageously of one or several beam collimators.

It is also advantageous that the etching device should be fitted with a system for controlling the position of the beam, and with means for cooling the beam down. It is also interesting that the device should comprise a system for monokinetic selection of the ions (between the ion source and the etched surface).

The beam interrupting means comprise advantageously means for applying an electric field that is more or less parallel to the etched surface.

This electric field is capable of diverting the beam and of preventing, thus, a new ion from reaching the surface. The use of the beam interrupting electric field is advantageously combined with that of a collimator, whereas a weak electric field is sufficient for interrupting the beam.

According to a preferred embodiment of the guiding means, the former may comprise means for applying a magnetic field, thereby diverting the ion beam by a certain angle.

Advantageously, this magnetic field is uniform and the deviation angle is 90°.

In a first variation, the guiding means comprise means for applying an electric field causing an electric deviation.

In a second variation, the guiding means implement at the same time a combined magnetic and electric field, for example in a Wien filter.

The means for relative displacement of the etched surface with respect to the ion beam comprise advantageously at least one element selected among a piezoelectric quartz and a ceramic, thereby displacing the semiconductor with respect to the ion beam incident on the etched surface.

Such displacing means enable controlled movement with accuracy in the order of one nanometer. The presence of several additional displacing means, such as two piezoelectric quartzes or two ceramics, enables moving the semiconductor or the insulant into two directions perpendicular to one another, which enables realising any etching pattern. It is then possible to create, along a rectilinear or circular line, insulating points on a semiconductor or semiconducting points on an insulant at regular intervals in order to produce digital encoding.

Preferably, displacement of the semiconductor is perpendicular to the incident ion beam.

It can also be performed with any angle with respect to the incident beam.

It is interesting that the etching device should comprise a tunnel effect and/or atomic strength microscope, performing local topographic and/or electric conductivity control of the etched surface processed.

Generally, such a microscope enables reading an etched pattern.

The etching device according to the invention is applicable to any etched surface, passivated or not, and is valid for any etching principle according to which the electrical or chemical nature or the topography of the surface is modified locally by an ion beam.

According to a first preferred embodiment of the etching device of the invention, the surface is occupied by first molecules of the semiconductor or insulant having a first chemical or topographic nature. The ion source is a source of highly charged and low energy positive ions and the etching device comprises means for applying a deceleration voltage, conferring the ions of the beam an average controlled velocity, enabling these ions, without contacting the etched surface, transforming a number of the first molecules of the surface into second molecules with a second chemical or topographic nature, whereby these ions are back-scattered.

The expression <<highly charged>> positive ions means ions having at least three positive charges and preferably at least fifteen positive charges. Their energy is said to be <<low>> with respect to that of ions obtained using a particle accelerator, whereby the latter energy is in the order of one MeV or one GeV. The low energy of the ions is thus smaller than a few tens keVs.

The deceleration voltage is applied in order to confer the ions a very low energy, close to 0 and generally smaller than a few tens eVs. Ions can be decelerated on the target, by polarising the said target or at any point of the line, by polarising the line.

An important aspect of this embodiment of the device according to the invention is that ions do not contact the surface but, on the contrary, attract to them or energise surface electrons, then run away into the opposite direction.

Interaction of the ions with the etched surface can be carried out in two ways, according notably to the nature and the disposition of the first molecules, the value of the deceleration voltage and the number charges of the ions. According to a first, preferred, interaction embodiment, the ions extract electrons from the number of these first molecules, become hollow atoms and are back-scattered. According to a second interaction embodiment, the ions cause energisation or extraction of the electrons, causing directly sputtering of fragments of the number of the first molecules.

The extraction of electrons of a semiconductor or insulant by highly charged and low energy ions is explained in the article of Jean-Pierre BRIAND presented at the Fourteenth International Conference of the Applications of Accelerators in Research and Industry, DENTON-TEXAS, 6–9 November 1996. Schematically, a highly charged and low energy ion starts interacting with the semiconductor medium or insulant at a relatively important distance from the surface, that may reach a few tens Å's. The ion attracts and captures then conduction or valence electrons that gradually occupy the Rydberg states of the ion. The ion then becomes a hollow atom, i.e. an atom having inner layers at least partially empty and external layers occupied by excited electrons. The number of electrons captured by the ion is considerably larger than its charge since a portion of these electrons is then expelled from the ion by Auger effect. The number of electrons torn away from the semiconductor by an ion is generally equal to approximately three times its charge.

Close to the surface, the ion generates an electric image (of negative charge) which exerts an attraction force on the ion and thereby tends to accelerate its movement toward the surface. However, the extraction of electrons by the ion creates on semiconductors or insulants positive holes at the surface which compensate for this electric image. The hollow atom formed out of the ion can then be back-scattered without any contact above the surface, by <<trampoline effect>>. The existence of contact or not and of penetration inside the semiconducting material depends on the initial kinematic conditions of the ion: beyond a critical velocity, the ion directed toward the surface reaches and enters the semiconducting material in spite of the formation of the positive holes. Conversely, the trampoline effect happens below this critical velocity. The value of the critical velocity depends on the extraction potential of the semiconducting material and on the initial charge of the positive ion.

Controlling the average velocity of the ions using the deceleration voltage enables producing the trampoline effect and giving the ions a controlled charge and energy.

After a certain travel, the hollow atoms often become hollow ions spontaneously, by Auger cascades. For simplification purposes, we shall designate by hollow atoms systematically the hollow atoms remaining from the atoms or having become ions again.

Transforming the first molecules into the second molecules can take different forms, according notably to the nature and the disposition of the first molecules, the value of the deceleration voltage and the number of charges of the ions.

In a first transformation embodiment, the first molecules have a first chemical nature and the second molecules have a second chemical nature. The extraction of the first molecules leads to the sputtering of certain atoms from these first molecules, which are replaced or not with other atoms or molecules, by sending or not an appropriate product.

According to a preferred embodiment of the etching device of the invention, corresponding to this first form of transformation, the change in chemical nature causes a change in electric nature. According to a first preferred embodiment, the first molecules are semiconducting and the second molecules are insulating, and consist respectively of SiH and of $SiO_2$. In a second preferred embodiment, the first and second molecules are respectively insulating and semiconducting and consist for instance respectively of $SiO_2$ and Si.

According to second form of transformation, the first molecules have a first topographic nature and the second molecules have a second topographic nature. Preferably, the first molecules then form a flat surface and the interaction of the ions generates the formation of peaks and holes.

Advantageously, according to a particular variation of the first embodiment with a change in electric nature, the first molecules have external links saturated by hydrogen atoms. The means for applying the deceleration voltage enable the ions of the beam to extract electrons from the number of the first molecules of the surface to make thus the number of the first molecules lose their atoms of hydrogen and to make the corresponding external links pending. The ions become hollow atoms after having extracted electrons and are back-scattered. Moreover, the etching device comprises a source of a product saturating the pending external links in order to form the second molecules, whereas these second molecules are insulating, the source sends the product toward the etched surface further to a passage of the ion beam.

The electrons extracted from the surface of the semiconductor are essentially electrons partaking of the external links of the first molecules. In their absence, the atoms of hydrogen saturating the external links are reduced to protons that are not linked to the surface any longer. The external links thus become pending.

In this embodiment of the etching device according to the invention, contrarily to the method consisting in forming blisters by ion shocks, it is not the topography of the surface, but its conductivity that is changed. Indeed, whereas the first molecules are semiconducting, the second are insulating. It is thus possible to generate insulating marks in the order of one nanometer, which enables increasing the storage of information by some $100^2$ or more with respect to the existing techniques. Moreover, it is easy and rapid to control locally the conductivity of the surface after etching, using a tunnel effect microscope.

In a first advantageous variation of the preferred embodiment of this first mode, the detection system comprises an instrument for measuring the photons transmitted as the electrons extracted from one electronic layer switch to another of the hollow atoms.

This instrument advantageously measures the X-rays transmitted. Indeed, the electrons captured in the hollow and non-sputtered atoms go down towards deeper layers while causing the transmission of X-rays, whereas filling the internal layers causes temporal marks spaced by a few tens of femto-seconds. These phenomena are described in the article of Jean-Pierre BRIAND quoted previously, as well as in an article of Jean-Pierre BRIAND et Coll. Published in Images de la Physique, 1992, pages 58–62.

The photons measured by the instrument may also consist of ultraviolets, visible light or infrared.

In a second advantageous variation of the preferred embodiment of this first mode, the detection system detects electrons transmitted by Auger effect by the hollow atoms.

In a preferred variation of the first embodiment, the detection system comprises a detection surface detecting the properties of the particles bumping against the detection surface and the back-scattered ions or hollow atoms are directed by the guiding means towards the detection surface.

In this detection variation based upon the detection of the ions or hollow atoms, a signal is produced after a flight duration, for example of one microsecond, between the interaction of an ion with the etched surface and the detection of this ion or of the corresponding hollow atom.

The properties detected consist preferably of the position, the velocity and the charge of the back-scattered hollow atoms.

This mode of detection is particularly advantageous since a signal is produced systematically at each interaction, whereas the ion or the hollow atom back-scattered having a trajectory defined accordingly and easily detectable.

The following embodiments can apply to an etched surface of the type of that of the previous method, occupied for instance by a compound of the semiconductor and hydrogen, but are also applicable to other types of surfaces, notably formed of lamellar compounds.

In a second embodiment of the etching device of the invention, the detection system detects ionised fragments of molecules of the etched surface, sputtered under the effect of interactions. It may be for example silicon atoms disconnected from the target at a distance.

When the first and the second embodiments are combined, the detection system detects ionised fragments of the number of the first molecules. These fragments consist advantageously, for the preferred embodiment, of cores of hydrogen atoms lost by the number of the first molecules.

These protons transmitted and possibly re-accelerated during the separation of hydrogen from the surface can sign an impact temporarily.

In a third embodiment of the etching device, the detection system detects a burst of electrons transmitted under the effect of interactions.

In a fourth embodiment of the etching device, the detection device comprises an instrument for measuring the photons transmitted by atoms from the etched surface.

In a fifth embodiment of the etching device, the detection system detects an electric charge generated in the semiconductor by the interactions.

The detection system may implement simultaneously several detection techniques in order to obtain additional pieces of information or to bear them out.

The invention also relates to an ion beam etching method enabling to produce an etched surface on a semiconductor or insulant. In this method:

positive ions are produced, a beam of these ions is sent towards guiding means, the ion beam is directed to the etched surface using the guiding means, the etched surface is moved relatively to the ion beam.

According to the invention, the following operations are performed iteratively in order to etch the surface considered:

interactions of ions of the beam with the etched surface are detected spatially and temporally, the ion beam is interrupted, the etched surface is moved relatively to the position of the beam, and the ion beam is restored.

The invention will be illustrated and understood better using embodiments and variations of the invention given below with reference to the appended drawings, on which:

FIG. 1A shows a semiconductor wafer intended for undergoing the etching method according to the invention.

FIG. 1B shows the wafer of FIG. 1A after pre-treatment.

FIG. 1C shows the wafer of FIGS. 1A and 1B after etching.

FIG. 2 is a flow chart of the various steps of a pre-treatment enabling switching from the wafer of FIG. 1A to that of FIG. 1B and from a mode of implementation of the etching method according to the invention enabling switching from the wafer of FIG. 1B to that of FIG. 1C.

FIG. 4 represents the interaction of a highly charged positive ion with the surface of the wafer of FIG. 1B. during the application of the method of FIG. 2 with the device of FIG. 3.

Figure 3:
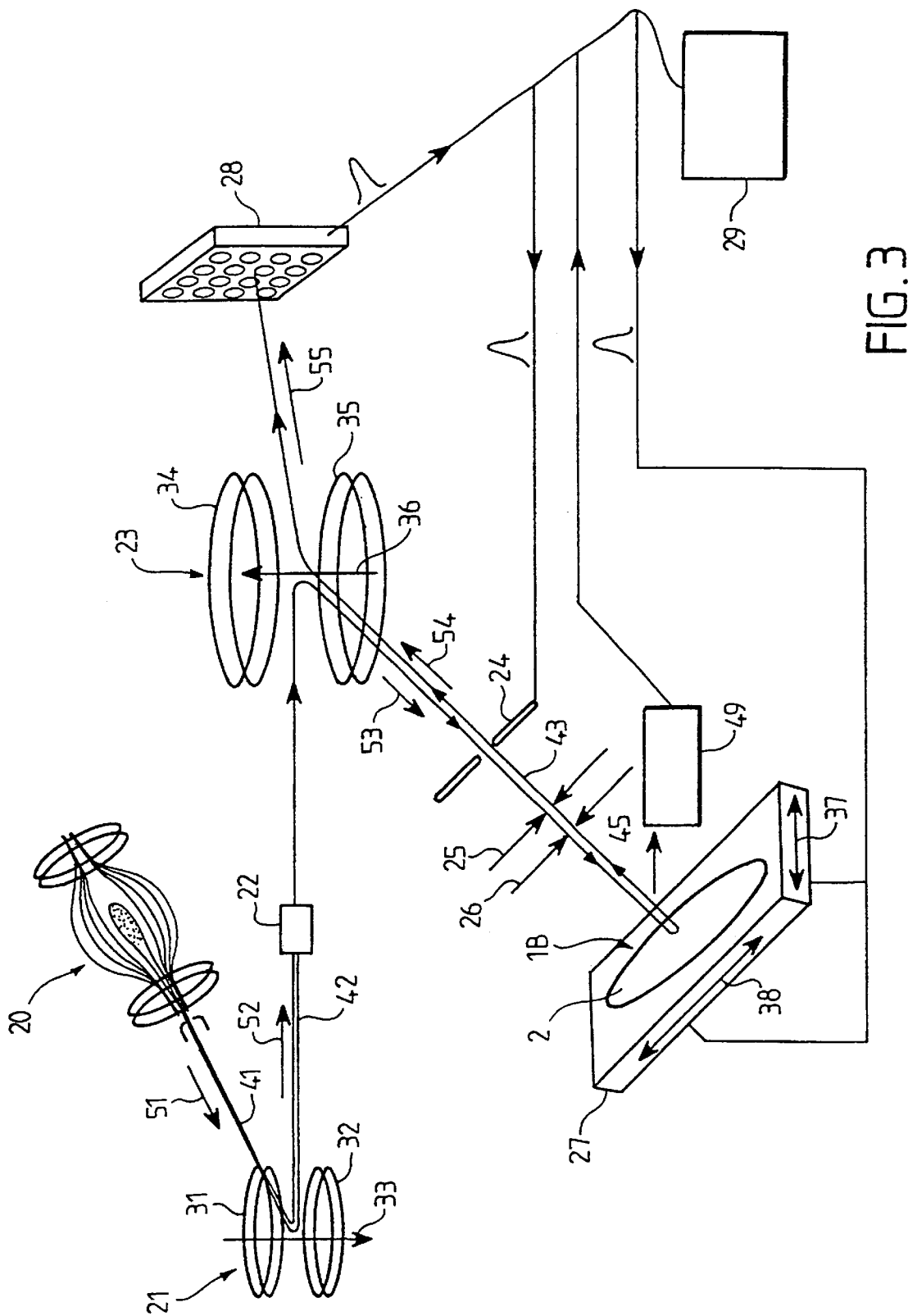
FIG. 3 represents an embodiment of an etching device according to the invention, enabling applying the schematised method of FIG. 2.

A wafer 1 of semiconductor, visible on FIG. 1A, is cut across a surface 2. The wafer 1 consists for example of silicon, an advantageous case that we shall keep throughout the expose. The semiconductor forming the wafer 1 can be pure or P- or N-boosted silicon at various concentrations, whereas the boosting concentration ranges advantageously between $10^{15}$ and $10^{18}$ atoms implanted per $cm^3$.

The surface 2 has an oxidised condition caused by exposure of the wafer 1 to open air. The semiconductor being silicon, the molecules of $SiO_2$ are thus formed in surface, on five to six atomic layers. The word <<surface>>designates in reality a superficial part of the wafer 1 with very small thickness e1 and occupied by the molecules of $SiO_2$. The thickness e1 is worth approximately 20 Å's.

The wafer 1 in this initial form 1A is applied a pre-treatment enabling pickling the surface 2 and covering it with a single hydrogen layer. This pre-treatment comprises two steps 11 and 12, illustrated on FIG. 2. According to the first step 11 of the pre-treatment, the wafer 1 is dipped into a first bath of fluorhydric acid, then in the second step 12 of the pre-treatment, the wafer is dipped into a second bath of fluorhydric acid and comprising ammonium ions. Thus, the surface 2 is pickled, a process that eliminates the oxygen combined in surface with the molecules of the semiconductor of the wafer 1. Thus pending external links are created, that are saturated immediately by hydrogen.

The pre-treatment leads to a pre-treated condition 1B of the wafer 1 (FIGS. 1B and 2) in which the surface 2 is extremely well passivated and plane and is occupied by SiH molecule over a thickness e2. The hydrogen atoms then occupy a single atomic layer on top of the wafer 1. The wafer 1 is then subjected to a set of operations aiming at replacing selectively a portion of the SiH molecules of the surface 2 with $SiO_2$ molecules, while keeping an excellent definition and the surface 2 extremely clean. The wafer 1 is then etched, as can be seen on FIG. 1C. As the zones determined on surface 2 are occupied by peaks or insulating marks of $SiO_2$, they form a network composed of insulating parts 5, the supplementary zones of the surface 2 remain occupied by SiH molecules.

To perform these operations, an etching device, presented on FIG. 3, is resorted to. This device comprises a source of ions 20 producing highly charged and low energy positive ions. The ion source 20 may use an ion preparation inside a very hot plasma confined to magnetic structures, such as an ECR (Electron Cyclotron Resonance) source. Its operating principle may also be the compression of electron beams in a solenoid, whereas atoms injected into the electron beam are ionised and trapped by a space charge simultaneously. The ion source 20 can then be of EBIS (Electron Beam ion Source) type.

The ions transmitted by the ion source 20 can be for instance argon, charged $Ar^{17+}$ or $Ar^{18+}$, oxygen or uranium. The number of positive charges may vary from a few units to 92 for uranium.

The ion source 20 thus produces an ion beam 41 along a first direction 51. This beam 41 is directed towards means for selecting a particular ionic species, for example $Ar^{17+}$. The means of selection consist advantageously of first means for applying 21 a magnetic field 33 that comprises two opposite spools 31 or 32 or permanent magnets. The magnetic field 33 is advantageously uniform. It may also be non-uniform in order to be focalising. The magnetic field 33 is advantageously perpendicular to the direction 51 of the incident beam 41. The means of selection thus produce a beam 42 of selected ions, along a direction 52.

In an embodiment, the means of selection are means for applying an electric field.

The etching device comprises preferably a system for direct positioning control of the beam 42, referred to as 22. This direct control system 22 comprises for instance an electron or photon cooling system or a system using the synchrotron motion. It reduces the transversal energy of the ions in the beam 42.

The beam 42 is directed towards guiding means, which guide the beam 42 towards the etched surface 2. These guiding means consist advantageously of second means 23 for applying a uniform magnetic field 36, comprising two opposite spools 34 and 35 or permanent magnets. The magnetic field 36, being preferably perpendicular to the direction 52 of propagation of the beam 42, thus directs the beam 42 along a direction 53 towards the surface 2, preferably in normal incidence.

In another embodiment, the guiding means consist of means for applying static or pulsed electric field.

The etching device then comprises means for interrupting the beam 42, advantageously with an electronically operated beam shutter 24. This shutter 24 is intended for interrupting the beam 42 when an etching is detected on the surface 2.

In another embodiment, the shutter 24 is replaced with means for applying an electric field perpendicular to the direction 53 of the beam 42, whereas application and suppression of this electric field play the part of closing and opening, respectively, the shutter 24.

The etching device also comprises, advantageously, a spatial localisation system of the beam 42, consisting for instance of one or several collimators 25, 26. For high accuracy etching, the collimators are nanometric.

The semiconductor 1B serving as a target is mounted on a translator 27, which enables motions in two directions 37 and 38 that are orthogonal to one another, and perpendicular to the direction 53 of the beam 42. The translator 27 comprises for instance two piezoelectric quartzes or two ceramics.

An electric field for decelerating the ions of the beam 42 is applied in the vicinity of the target, by polarisation of the said target. This electric field decelerates the ions of the beam 42 sufficiently so that the said ions extract electrons from the surface 2 without making any contact with this surface and so that they are retroreflected in the form of hollow atoms (or hollow ions). The ions transmitted by the ion source 20 with an energy of several keV/q for example ranging between 5 and 20 keV/q, q designating the number of positive charges of each of these ions, this electric deceleration field gives the ions an energy ranging between 0 and a few eV/q in a controlled manner. Applying the electric field may be carried out using a plane capacitor with potentiometer. Controlling the deceleration time enables reducing the approaching distance of each ion with respect to the surface 2 and hence the size of the elementary interaction zone pickled by this ion.

In another embodiment, the deceleration does not take place on the target but at some point of the beam line, by polarisation of the line.

The hollow atoms retroreflected by the surface 2 form a beam 43, running along one direction 54 parallel to the direction 53 and in opposite direction to the beam 42. The beam 43 composed of hollow atoms thus runs through the collimators 25 and 28, the shutter 24 and the means for applying 23 the magnetic field 36, in the illustrated example. This magnetic field 35 diverts the beam 43 to a direction 55, towards a detection surface 28.

The detection surface 28 gives the position and advantageously the velocity and the charge, of the hollow atoms of the incident beam 43. This detection surface 28 can be for example a network of chaneltrons.

The etching device advantageously comprises an instrument 49 for measuring photons, notably X-rays, transmitted during the passages of electrons from one electronic layer to another of the hollow atoms of the beam 43.

The beams 41, 42 and 43 and the surface 2 of the wafer 1 are protected from the surrounding atmosphere by a vacuum casing.

The etching device also comprises a processing unit 29 connected to the shutter 24, to the translator 27, to the detection surface 28 and to the measuring instrument 49. This processing unit 29 receives signals from the detection surface 28 and the measuring instrument 49, and is capable of commanding the opening and the closing of the shutter 24 as well as displacements of the translator 27.

The etching device is preferably supplemented by a tunnel effect microscope and/or an atomic force microscope, performing local controls. of topographic and/or electric conductivity of the processed surface 2.

In operation, during the etching step 18 (FIG. 2), the following operations are carried out in succession. A beam 41 of highly charged and low energy positive ions is produced using the ion source 20, an ionic species of this beam 41 is selected by the means 21 for applying the magnetic field 33, the beam 42 obtained is guided towards the surface 2 by the means of application 23 of the magnetic field 36 while performing direct positioning control using the system 22 and spatial localisation using the collimator 25 and 26 and the beam 42 is decelerated.

When the ions of the beam 42 are sufficiently close to the surface 2, they begin to interact with the said surface. The ions may capture the electrons from the wafer 1 as soon as they reach a acquisition zone extending up to a distance d above the surface 2. Thus, as soon as an ion 40 enters a acquisition zone, it interacts with a portion 46 of this surface 2 delineating approximately a disk of diameter D with contours at a distance d from the ion 40, as represented on FIG. 4. The diameter D of the interaction portion 46 therefore does not exceed 2 d. The ion 40 attracts and extracts superficial electrons from the portion 46 as it approaches the acquisition zone. This approach is controlled while adjusting the kinetic energy of the ion 40 thanks to the electric deceleration field. The ion 40 acquires electrons that transforms it into a hollow atom. This hollow atom is then back scattered without any contact by a trampoline effect and it is directed towards the detection surface 28.

The ions can also energise atoms in the etched surface 2 at a distance greater than the distance d, i.e. outside the acquisition zone. They thus induce surface modifications.

Extracting electrons from the surface 2 causes hydrogen atoms saturating the corresponding external links to disappear from this surface 2. These external links also become pending. A product saturating the pending external links is then sent to the pickled zone, in order to form molecules of an insulating compound. A simple way to proceed consists therefore in applying partial vacuum in the vacuum casing, in the order of $10^{-9}$ Pa. Oxygen present in the casing then saturates the pending links immediately, in order to form the insulating compound.

The etching process consists of the succession and iteration of four operations 13–16, controlled by the processing unit 29.

In a first operation 13, the arrival of hollow atoms back scattered by the surface 2 is detected on the detection surface 28, after a flight duration. The processing unit 29 receives an impact signal corresponding to this detection. In a second operation 14, the arrival of the beam 42 on the target is interrupted, while controlling the closing of the shutter 24. In a third operation 15, the controlled motion of the translator 27 is then triggered, over a distance advantageously in the order of one nanometer. In a fourth operation 16, the opening of the shutter 24 is controlled so that the beam 42 can again reach the surface 2.

By repeating the operations 13 to 16, the zones corresponding to the insulating parts 5 predetermined are etched. The state 1C of the wafer 1 is then obtained by a succession of local picklings at well-defined points.

Advantageously, the measuring instrument 49 sends to the processing unit 29 additional information on the extraction of electrons from the surface 2.

Preferably, at a later stage 17 the surface 2 is controlled locally for electric and/or topographic conductivity using tunnel effect and atomic force microscopes.

In an embodiment variation, several layers of insulating compound are formed in the insulating portions 5, whereas the number of layers is preferably smaller than 5. For example, the partial pressure or injection of the saturating product is controlled.

In an advantageous embodiment, the surface 2 is then covered with some coating, for example a conductive coating.

In other embodiments, the detection surface 28 is replaced or associated with a detection system that detects electrons transmitted by Auger effect by the hollow atoms, pickled hydrogen cores or semiconductor atoms of the target sputtered from the surface 2, a burst of transmitted electrons, photons transmitted by atoms from the etched surface or an electric charge appearing on the target.

Some of these embodiments can be used not only for contact-less interactions between the ion beam and the target, but also for final or transitory ion implants in the semiconductor 1. In the latter case, ion deceleration is not necessary and they may reach the surface 2 with more energy.

Several of these embodiments are also applicable not only to a semiconductor, but also to an insulant.

What is claimed is:

1. An ion beam etching device that enables producing an etched surface (2) on a semiconductor (1) or an insulant comprising:
    a positive ion source (20),
    means (23) for guiding a beam (42) of the said ions (40) thereby directing the said beam (42) to the etched surface (2), and
    means (27) for displacing the etched surface (2) relatively to the ion beam (42),
    a system for space-time detection (28, 49) of ion interactions (40) of the beam (42) with the etched surface (2),
    means (24) for interrupting the ion beam (42), and
    a processing unit (29) linked to the displacement means (27), to the detection system (28) and the beam interruption means (24), controlling the successive operations of: detecting (40) the interruptions of the ions in the beam (42) with the etched surface (2), beam interruption (42), relative displacement of the etched surface (2) in relation to the position of the beam (42) and restoring the beam (42).

2. An etching device according to claim 1, characterised in that it comprises a system for spatial localisation (25, 26) of the ion beam (42), interposed between the ion source (20) and the etched surface (2).

3. An etching device according to claim 1, characterised in that the beam interrupting means (24) comprise means for applying an electric field that is more or less parallel to the etched surface (2).

4. An etching device according to claim 1, characterised in that the guiding means (23) comprise means for applying a uniform magnetic field (36), diverting the ion beam (42) by 90°.

5. An etching device according to claim 1, characterised in that the displacing means (27) comprise at least one element selected among a piezoelectric quartz and a ceramic, thereby displacing the semiconductor (1) with respect to the ion beam (42) incident on the etched surface (2).

6. An etching device according to claim 1, characterised in that it comprises a tunnel effect microscope, controlling the etched surface processed (2) for local electric conductivity.

7. An etching device according to claim 1, characterised in that it comprises an atomic strength microscope, performing local topographic control of the etched surface processed (2).

8. An etching device according to claim 1, characterised in that the said surface (2) is occupied by first molecules of the semiconductor or insulant having a first chemical or topographic nature, the ion source (20) is a source of highly charged and low energy positive ions and the etching device comprises means for applying a deceleration voltage, conferring the ions (40) of the beam (42) an average controlled velocity, enabling these ions (40), without contacting the etched surface (2), to transform a plurality of the first molecules of the surface (2) into second molecules with a second chemical or topographic nature, whereby these ions are back-scattered.

9. An etching device according to claim 8, characterised in that the first molecules having external links, whereas the said links are saturated by hydrogen atoms, the means for applying the deceleration voltage enable the ions (40) of the beam (42) to extract electrons from the said plurality of the first molecules of the said surface (2) and to make thus the plurality of the first molecules lose their atoms of hydrogen and to make the corresponding external links pending, whereas the said ions (40) become hollow atoms after having extracted electrons and are back-scattered, and the etching device comprises a source of a product saturating the pending external links in order to form the second molecules, whereas these second molecules are insulating, the source sends the product toward the etched surface (2) further to a passage of the ion beam (42).

10. An etching device according to claim 9, characterised in that the detection system comprises an instrument (49) for measuring the photons transmitted as the electrons extracted from one electronic layer switch to another of the hollow atoms.

11. An etching device according to claim 9, characterised in that the detection system detects electrons transmitted by Auger effect by the hollow atoms.

12. An etching device according to any of the claims 8 to 11, characterised in that the detection system comprises a detection surface (28) detecting the properties of the particles bumping against the detection surface and the back-scattered ions or hollow atoms are directed by the guiding means (23) towards the detection surface (28).

13. An etching device according to claim 8, characterised in that the detection system detects ionised fragments of molecules of the etched surface, sputtered under the effect of the said interactions.

14. An etching device according to claim 13, characterised in that the detection system detects a burst of electrons transmitted under the effect of the said interactions.

15. An etching device according to claim 8, characterised in that the detection system comprises an instrument for measuring the photons transmitted by atoms from the etched surface (2).

16. An etching device according to claim 8, characterised in that detection system detects an electric charge generated in the semiconductor (1) by the said interactions.

17. An ion beam etching method enabling to produce an etched surface (2) on a semiconductor (1) or insulant. In this method:

positive ions are produced, a beam (41) of the said ions is sent towards guiding means (23), the ion beam (42) is directed to the etched surface (22) using the guiding means (23), the etched surface (2) is moved relatively to the ion beam (42), characterised in that the following operations are performed iteratively in order to etch the surface (2) considered:

interactions of ions (40) of the beam (42) with the etched surface (2) are detected spatially and temporally, the ion beam (42) is interrupted, the etched surface (2) is moved relatively to the position of the beam (42), and the ion beam (42) is restored.

* * * * *